(12) United States Patent  (10) Patent No.: US 8,663,878 B2
Yu et al.                  (45) Date of Patent:     Mar. 4, 2014

(54) MASK AND METHOD FOR FORMING THE SAME

(75) Inventors: Shinn-Sheng Yu, Hsinchu (TW);
Anthony Yen, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 42 days.

(21) Appl. No.: 13/542,550

(22) Filed: Jul. 5, 2012

(65) Prior Publication Data

US 2014/0011121 A1    Jan. 9, 2014

(51) Int. Cl.
G03F 1/24    (2012.01)
G06F 1/22    (2006.01)

(52) U.S. Cl.
USPC .................................................. 430/5

(58) Field of Classification Search
USPC .................. 430/5, 322, 323; 378/35
See application file for complete search history.

(56) References Cited

U.S. PATENT DOCUMENTS

2005/0221238 A1*  10/2005  Dierichs ............... 430/396

OTHER PUBLICATIONS

Yan et al., "Direct Metal Pattern Writing by VUV Photodissocation", J. Vac. Sci. Technol. B 22(6), Nov./Dec. 2004, 2004 American Vacuum Society, pp. 3202-3205.
Yu et al., "On the Extensibility of Extreme-UV Lithography", Proc. SPIE, 7969, 79693A (2011), 11 pages.

* cited by examiner

*Primary Examiner* — Stephen Rosasco
(74) *Attorney, Agent, or Firm* — Haynes and Boone, LLP

(57) ABSTRACT

A mask can be used in lithography to fabricate a semiconductor wafer. The mask includes a low thermal expansion material (LTEM) substrate, a reflective multilayer (ML) above the LTEM substrate; and a patterned absorption layer above the reflective ML. The patterned absorption layer includes a thickness ranging between 25 nm and 31 nm, a refractive index ranging between 0.84 and 0.93 and an extinction coefficient ranging between 0.038 and 0.051.

20 Claims, 3 Drawing Sheets

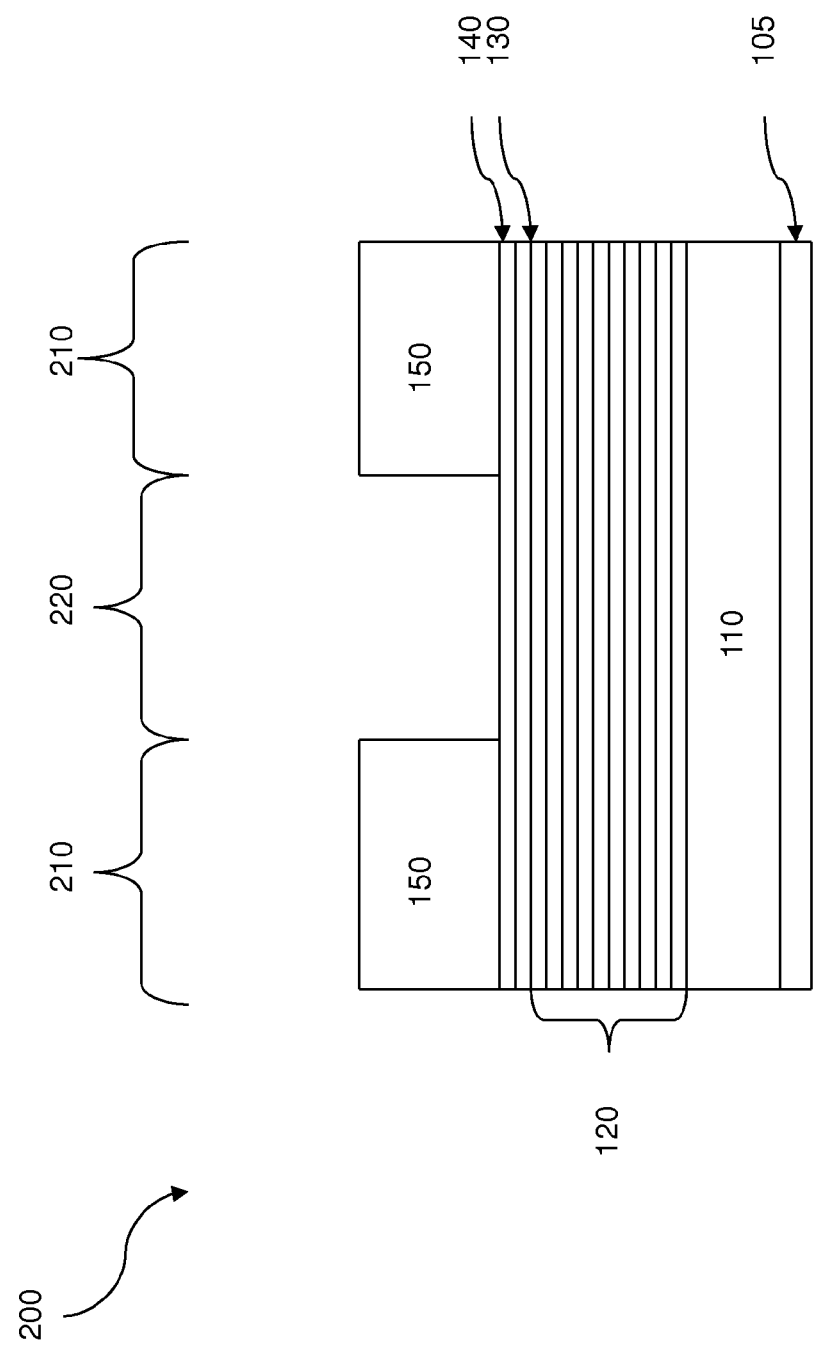

MASK AND METHOD FOR FORMING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing. For these advances to be realized, similar developments in IC processing and manufacturing are needed. For example, the need to perform higher resolution lithography processes grows. One lithography technique is extreme ultraviolet lithography (EUVL). Other techniques include X-Ray lithography, ion beam projection lithography, electron beam projection lithography, and multiple electron beam maskless lithography.

The EUVL employs scanners using light in the extreme ultraviolet (EUV) region, having a wavelength of about 1-100 nm. Some EUV scanners provide 4x reduction projection printing, similar to some optical scanners, except that the EUV scanners use reflective rather than refractive optics, i.e., mirrors instead of lenses. EUV scanners provide desired patterns on wafers by transferring mask patterns defined by an absorber layer. Currently, binary intensity masks (BIM) accompanied by on-axis illumination (ONI) are employed in EUVL. In order to achieve adequate aerial image contrast for future nodes, e.g., nodes with the minimum pitch of 32 nm and 22 nm, etc., several techniques, e.g., the attenuated phase-shifting mask (AttPSM) and the alternating phase-shifting mask (AltPSM), have been developed to obtain resolution enhancement for EUVL. But each technique has its limitation needed to be overcome. For example, an absorption layer however may not fully absorb the incident light and a portion of the incident light is reflected from the absorption layer. Also the thickness of the absorption layer causes the shadowing effect. All of these often result in reduced aerial image contrast, which may lead to poor pattern profiles and poor resolution, particularly as pattern features continue to decrease in size. It is desired to have improvements in this area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2-3 illustrate cross sectional views of various aspects of one embodiment of a mask at various stages of a lithography process constructed according to aspects of the present disclosure.

DETAILED DESCRIPTION

Figure 1:
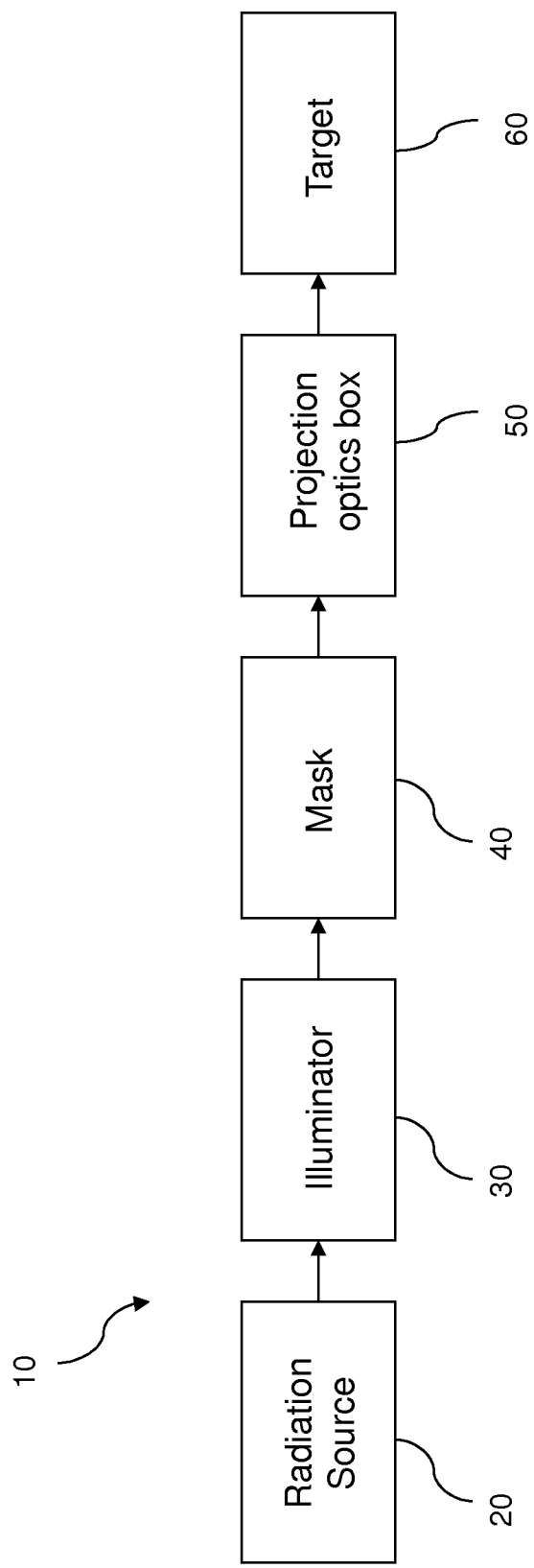
FIG. 1 is a block diagram of a lithography system for implementing one or more embodiments of the present invention.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Referring to FIG. 1, an EUV lithography process 10 that may benefit from one or more embodiments of the present invention is disclosed. The EUV lithography process 10 employs an EUV radiation source 20 having a wavelength of about 1-100 nm.

The EUV lithography process 10 also employs an illuminator 30. The illuminator 30 may comprise refractive optics, such as a single lens or a lens system having multiple lenses (zone plates) and/or reflective optics, such as a single mirror or a mirror system having multiple mirrors in order to direct light from the radiation source 20 onto the mask 40. In the EUV wavelength range, reflective optics is employed generally. Refractive optics, however, can also be realized by e.g., zoneplates.

The EUV lithography process 10 also employs a mask 40. The mask 40 can be a transmissive mask or a reflective mask. In the present embodiment, the mask 40 is a reflective mask such as described in further detail below. The mask 40 may incorporate other resolution enhancement techniques such as phase-shifting mask (PSM) and/or optical proximity correction (OPC).

The EUV lithography process 10 also employs a projection optics box (POB) 50. The POB 50 may have refractive optics or reflective optics. The radiation reflected from the mask 40 (e.g., a patterned radiation) is collected by the POB 50. The POB 50 may include a magnification of less than one (thereby reducing the patterned image included in the radiation). The POB 50 directs the collected radiation to expose a target 60.

The target 60 includes a semiconductor wafer with a photosensitive layer (e.g., photoresist or resist), which is sensitive to the EUV radiation. The target 60 may be held by a target substrate stage. The target substrate stage provides control of the target substrate position such that the image of the mask is scanned onto the target substrate in a repetitive fashion (though other lithography methods are possible).

The following description refers to the mask 40 and a mask fabrication process. The mask fabrication process includes two steps: a blank mask fabrication process and a mask patterning process. During the blank mask fabrication process, a blank mask is formed by depositing suitable layers (e.g., multiple reflective layers) on a suitable substrate. The blank mask is patterned during the mask patterning process to have a design of a layer of an integrated circuit (IC) device (or chip). The patterned mask is then used to transfer circuit patterns (e.g., the design of a layer of an IC device) onto a semiconductor wafer. The patterns can be transferred over and over onto multiple wafers through various lithography processes. Several masks (for example, a set of 15 to 30 masks) may be used to construct a complete IC device.

In general, various masks are fabricated for being used in various processes. Types of EUV masks include binary intensity mask (BIM) and phase-shifting mask (PSM). An example BIM includes an almost totally absorptive region (also referring to as an opaque region) and a reflective region. In the opaque region, an absorber is present and an incident light beam is almost fully absorbed by the absorber. The absorber can be made of materials containing chromium, chromium oxide, chromium nitride, aluminum-copper, titanium, titanium nitride, tantalum, tantalum oxide, tantalum nitride, and tantalum boron nitride. In the reflective region, the absorber is removed and the incident light is reflected by a multilayer (ML), which will be described in further detail below. A PSM includes an absorptive region and a reflective region. A portion of the incident light reflects from the absorptive region with a proper phase difference with respect to a light reflected from the reflective region to enhance the resolution and imaging quality. The absorber of the PSM can be made by materials such as tantalum nitride and tantalum boron nitride at a specific thickness. The PSM can be attenuated PSM (AttPSM) or alternating PSM (AltPSM). For an AttPSM, the reflectivity at the absorber top surface is usually 2%-15%. For an AltPSM, the reflectivity at the absorber top surface is usually larger than 50%.

Figure 2:
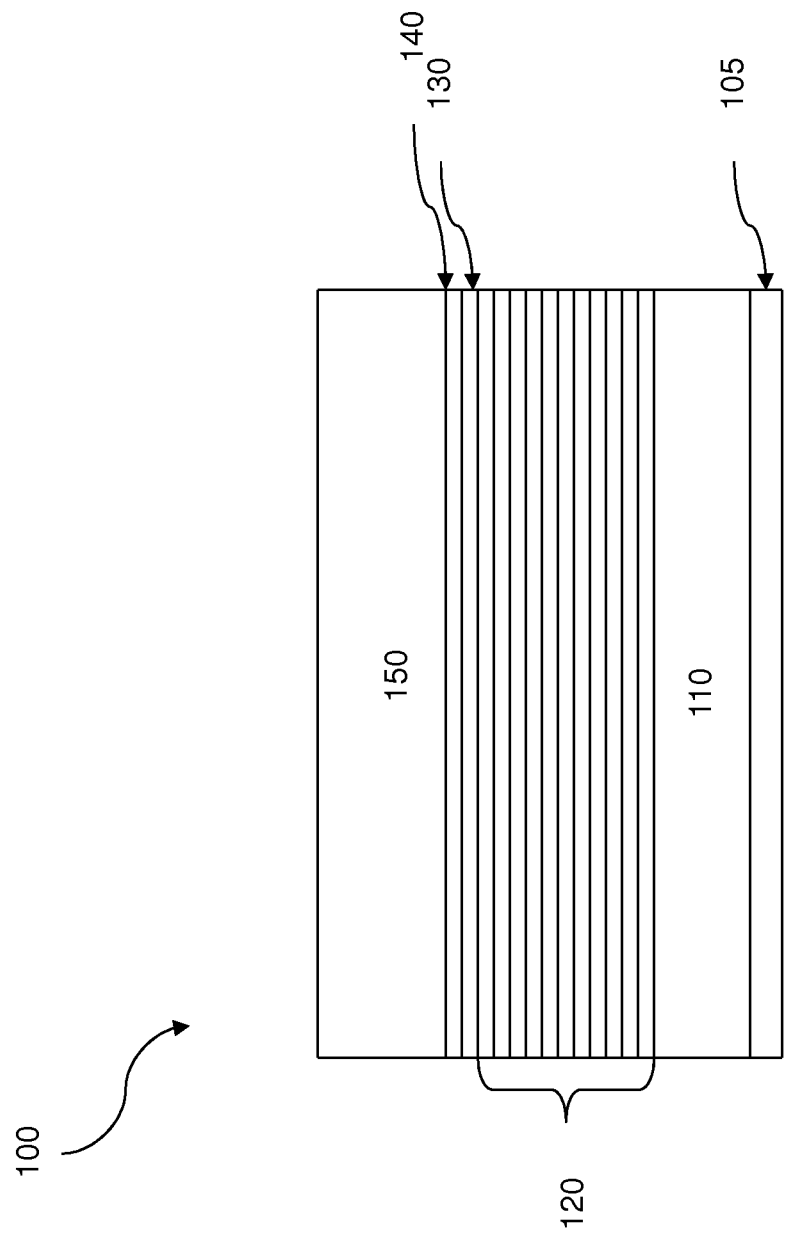

Referring to FIG. 2, a blank mask 100 includes a substrate 110 made of low thermal expansion material (LTEM). The LTEM material may include TiO2 doped SiO2, silicon, and/or other low thermal expansion materials known in the art. The LTEM substrate 110 serves to minimize image distortion due to mask heating. In the present embodiment, the LTEM substrate includes materials with a low defect level and a smooth surface. In addition, a conductive layer 105 may be deposited under (as shown in the figure) the LTEM substrate 110 for the electrostatic chucking purpose. In an embodiment, the conductive layer 105 includes chromium nitride (CrN), though other compositions are possible.

A reflective multilayer (ML) 120 is formed above the LTEM substrate 110. According to Fresnel equations, light reflection occurs when light propagates across the interface between two materials of different refractive indices. Light reflection is larger when the difference of refractive indices is larger. To increase light reflection, one may also increase the number of interfaces by forming a multilayer of alternating materials and let lights reflected from different interfaces interfere constructively by choosing appropriate thickness for each layer inside the multilayer. However, the absorption of the employed materials for the multilayer limits the highest reflectivity that can be achieved. The reflective ML 120 includes a plurality of film pairs, such as molybdenum-silicon (Mo/Si) film pairs (e.g., a layer of molybdenum above or below a layer of silicon in each film pair). Alternatively, the reflective ML 120 may include molybdenum-beryllium (Mo/Be) film pairs, or any two materials or material combinations with large difference in refractive indices and small extinction coefficients. The thickness of each layer of the reflective ML 120 depends on the wavelength of the incident light and the angle of incidence on the mask. For a specified angle of incidence, the thickness of the reflective ML 120 is adjusted to achieve maximal constructive interference for lights reflected at different interfaces of the ML 220. A typical number of film pairs is 20-80, however any number of film pairs is possible. In an embodiment, the reflective ML 120 includes forty pairs of layers of Mo/Si. Each Mo/Si film pair has a thickness of about 7 nm, e.g., 3 nm for Mo and 4 nm for Si. In this case, a reflectivity of about 70% is achieved.

A capping layer 130 is formed above the reflective ML 120 to prevent oxidation of the reflective ML. In the present embodiment, the capping layer 130 includes silicon with about 4-7 nm thickness. A buffer layer 140 is formed above the capping layer 130 to act as an etching stop layer in a patterning or repairing process of an absorption layer, which will be described later. The buffer layer 140 has different etching characteristics from the absorption layer. The buffer layer 140 includes ruthenium (Ru), Ru compounds such as RuB, RuSi, chromium (Cr), Cr oxide, and Cr nitride. A low temperature deposition process is often chosen for the buffer layer to prevent inter-diffusion of the reflective ML 120. In the present embodiment, the buffer layer 140 contains ruthenium and is of the thickness of 2-5 nm. In one embodiment, the capping layer and the buffer layer is a single layer.

An absorption layer 150 is formed on the buffer layer 140. The absorption layer 150 absorbs radiation in the EUV wavelength range projected onto a mask 200. In order to achieve enough optical density, the thickness of the absorption layer is usually sufficiently large, e.g. 83 nm. The thickness of the absorption layer, accompanied by the chief ray angle of incidence (CRAO) being not equal to zero, creates shadows beside mask patterns, referred to as the shadowing effect. The shadowing effect causes critical dimension (CD) difference for horizontal and vertical patterns, shift of patterns, and intrafield CD variation (if the azimuthal angle of the incident light varies in the exposure field), though they can be modeled and corrected. The shadowing effect also causes aerial image contrast loss, which will reduce the process window and increase the mask error enhancement factor (MEEF). The shadowing effect becomes more severe when we go to smaller technology nodes if the thickness of the absorption layer is kept the same. This is because the size of the shadow occupies a larger portion of the size of the reflective region. The shadowing effect impedes EUVL from going to smaller technology nodes.

To reduce the shadowing effect, a thinner absorption layer is preferred. But a thinner absorption layer may result in increase of the reflected light from the absorptive region, which will lead to aerial image contrast loss unless the reflected light from the absorptive region is about 180-degree out of phase with respect to the reflected light from the reflective region. In the present disclosure, the absorption layer 150 is configured to have a relatively thin thickness and to produce an about 180-degree phase shift (for the reflected light from the absorptive region 210 with respect to the reflected light from the reflective region 220). The absorption layer 150 is also configured to make the amplitudes of 0-th and 1-st diffraction orders the same for one-dimensional equal line/space patterns (the widths of the absorptive region and the reflective region being the same). During manufacturing of the blank mask 100, processing variations will bring in film property variations, such as film composition. The absorption layer 150 is also configured to have an adequate allowance of film property variations.

Base on above considerations, in the present disclosure, the absorption layer 150 includes materials having a thickness ranging between 25 nm and 31 nm, a refractive index ranging between 0.84 and 0.93 and an extinction coefficient ranging between 0.038 and 0.051. The material or materials of the absorption layer 150 meet simultaneously above criteria of thickness, refractive index and extinction coefficient. In one embodiment, the absorption layer 150 contains palladium. In another embodiment, the absorption layer 150 includes palladium with a thickness of about 28 nm.

One or more of the layers 105, 120, 130, 140 and 150 layers may be formed by various methods, including physical vapor deposition (PVD) process such as evaporation and DC magnetron sputtering, a plating process such as electrodeless plating or electroplating, a chemical vapor deposition (CVD) process such as atmospheric pressure CVD (APCVD), low pressure CVD (LPCVD), plasma enhanced CVD (PECVD), or high density plasma CVD (HDP CVD), ion beam deposition, spin-on coating, metal-organic decomposition (MOD), and/or other methods known in the art.

Referring to FIG. 3, in the present embodiment, the absorption layer 150 is patterned to form the design layout pattern mask 200. In one embodiment, the palladium absorption layer 150 is formed by MOD technique. First, palladium acetate (Pdac), dissolved in chloroform solution, is spin-coated on the buffer layer 140 to form a Pdac film of a specified thickness. Second, a local exposure is performed on the Pdac film. This can be realized by VUV radiation accompanied by another mask, or by electron beam or ion beam direct writing. By receiving exposure, Pdac will decompose into palladium and volatile organic species. Thus, local deposition of palladium is achieved and the palladium absorption layer 150 with palladium at specified regions is obtained. Thus, local deposition of palladium is achieved and a plurality of specified absorptive regions 210 (where palladium exists) and a plurality of specified reflective regions (where palladium does not exist) are obtained.

The mask 200 may incorporate other resolution enhancement techniques such as an optical proximity correction (OPC). The mask 200 may undergo a defect repair process by a mask defect repair system. The mask defect repair system is a suitable system, such as an e-beam repair system and/or a focused ion beam (FIB) repair system.

In one embodiment, the mask 200 is used as the mask 40 in the EUV lithography process 10, as being described in FIG. 1.

Based on the above, it can be seen that the present disclosure offers a mask for lithography process. The mask is configured with a thin absorption layer to reduce the shadowing effect, improve aerial image contrast and process window for technology nodes of N14 and beyond. According to the present disclosure, the thin absorption layer is made by choosing a material which satisfies specified conditions of thickness, refractive index and extinction coefficient simultaneously.

The present disclosure provides many different embodiments of an extreme ultraviolet (EUV) mask blank that provide one or more improvements over the prior art. In one embodiment, the EUV mask blank includes a low thermal expansion material (LTEM) substrate, a reflective multilayer (ML) above the LTEM substrate and an absorption layer above the reflective ML. The absorption layer includes a thickness ranging between 25 nm and 31 nm; a refractive index ranging between 0.84 and 0.93; and an extinction coefficient ranging between 0.038 and 0.051.

In another embodiment, an extreme ultraviolet (EUV) mask includes a low thermal expansion material (LTEM) substrate, a reflective multilayer (ML) above the LTEM substrate and a patterned absorption layer above the reflective ML. The patterned absorption layer has a thickness ranging between 25 nm and 31 nm; a refractive index ranging between 0.84 and 0.93; and an extinction coefficient ranging between 0.038 and 0.051.

In yet another embodiment, a method of an extreme ultraviolet lithography (EUVL) process includes receiving an EUV mask, exposing the EUV mask by a radiation source through an illuminator, collecting the radiation reflected from the EUV mask by a projection optics box (POB) and directing the collected radiation to expose a target.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An extreme ultraviolet (EUV) mask blank, comprising:
a low thermal expansion material (LTEM) substrate;
a reflective multilayer (ML) above the LTEM substrate; and
an absorption layer above the reflective ML, wherein the absorption layer includes a thickness ranging from about 25 nm to about 31 nm, a refractive index ranging from about 0.84 to about 0.93, and an extinction coefficient ranging from about 0.038 to about 0.051.

2. The mask blank of claim 1, wherein the absorption layer contains palladium.

3. The mask blank of claim 2, wherein a thickness of the palladium-containing absorption layer is about 28 nm.

4. The mask blank of claim 1, further comprising a capping layer above the reflective ML and below the absorption layer.

5. The mask blank of claim 4, further comprising a buffer layer above the capping layer and below the absorption layer.

6. The mask blank of claim 1, wherein the LTEM substrate contains titania doped fused silica.

7. An extreme ultraviolet (EUV) mask, comprising:
a low thermal expansion material (LTEM) substrate;
a reflective multilayer (ML) above the LTEM substrate; and
a patterned absorption layer above the reflective ML, wherein the absorption layer includes a thickness ranging from about 25 nm to about 31 nm, a refractive index ranging from about 0.84 to about 0.93, and an extinction coefficient ranging from about 0.038 to about 0.051.

8. The mask of claim 7, wherein the patterned absorption layer contains palladium.

9. The mask of claim 8, wherein a thickness of the patterned palladium-containing absorption layer is about 28 nm.

10. The mask of claim 7, further comprising a capping layer above the reflective ML and below the patterned absorption layer.

11. The mask of claim 10, wherein the capping layer contains silicon.

12. The mask of claim 10, further comprising a buffer layer above the capping layer and below the patterned absorption layer.

13. The mask of claim 12, wherein the buffer layer contains ruthenium.

14. The mask of claim 12, wherein the buffer layer contains chromium.

15. A an extreme ultraviolet lithography (EUVL) method comprising:
- receiving an EUV mask;
- exposing the EUV mask by a radiation source through an illuminator;
- collecting the radiation reflected from the EUV mask by projection optics box (POB); and
- directing the collected radiation to expose a target.

16. The method of claim 15, wherein the EUV mask includes:
- a low thermal expansion material (LTEM) substrate;
- a reflective multilayer (ML) above the LTEM substrate; and
- a patterned absorption layer above the reflective ML, wherein the absorption layer includes a thickness ranging from about 25 nm and about 31 nm, a refractive index ranging from about 0.84 to about 0.93, and an extinction coefficient ranging from about 0.038 to about 0.051.

17. The method of claim 16, wherein the patterned absorption layer contains palladium.

18. The method of claim 17, wherein a thickness of the patterned palladium-containing absorption layer is about 28 nm.

19. The method of claim 16, wherein the EUV mask further includes:
- a capping layer above the reflective ML and below the patterned absorption layer; and
- a buffer layer above the capping layer and below the patterned absorption layer.

20. The method of claim 17, wherein the patterned palladium-containing absorption layer is formed by metal-organic decomposition (MOD).

* * * * *